(12) United States Patent
Morris

(10) Patent No.: US 9,082,745 B2
(45) Date of Patent: Jul. 14, 2015

(54) CIRCUIT MODULE

(75) Inventor: Terrel Morris, Garland, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 162 days.

(21) Appl. No.: 13/640,290

(22) PCT Filed: Apr. 30, 2010

(86) PCT No.: PCT/US2010/033313
§ 371 (c)(1),
(2), (4) Date: Oct. 9, 2012

(87) PCT Pub. No.: WO2011/136819
PCT Pub. Date: Nov. 3, 2011

(65) Prior Publication Data
US 2013/0050949 A1  Feb. 28, 2013

(51) Int. Cl.
  *H05K 7/20* (2006.01)
  *H01L 23/40* (2006.01)
  *H01L 25/16* (2006.01)
  *H04N 5/225* (2006.01)
  (Continued)

(52) U.S. Cl.
  CPC ........ *H01L 23/4006* (2013.01); *H01L 23/4093* (2013.01); *H01L 25/167* (2013.01); *H04N 5/2253* (2013.01); *H04N 5/335* (2013.01); *H05K 3/325* (2013.01); *H01L 23/42* (2013.01); *H01L 24/16* (2013.01); *H01L 27/14618* (2013.01); *H01L 2224/16225* (2013.01); *H01L 2924/14* (2013.01); *H01L 2924/1433* (2013.01); *H01L 2924/1434* (2013.01); *H01L 2924/15192* (2013.01); *H01L 2924/15311* (2013.01); *H01L 2924/15312* (2013.01); *H01L 2924/15313* (2013.01); *H05K 2201/10121* (2013.01); *H05K 2201/10393* (2013.01); *Y10T 29/49126* (2015.01); *Y10T 29/49144* (2015.01)

(58) Field of Classification Search
  CPC ............ H05K 2201/1421; H05K 2201/10393; H05K 3/325; H01L 23/4006; H01L 23/4093; H01L 25/167
  USPC .................................. 165/185; 361/709, 715
  See application file for complete search history.

(56) References Cited

U.S. PATENT DOCUMENTS 5,473,510 A * 12/1995 Dozier, II ...................... 361/719
5,625,732 A   4/1997 Chun et al.
(Continued)

FOREIGN PATENT DOCUMENTS

| KR | 10-2002-0035819 | 5/2002 |
|---|---|---|
| KR | 10-2007-0093408 | 9/2007 |
| WO | WO-2006069554 | 7/2006 |

OTHER PUBLICATIONS

PCT Search Report, Dec. 31, 2010, HPDC, Application No. PCT/US2010/033313, Filed Apr. 30, 2010.

*Primary Examiner* — Gregory Thompson
(74) *Attorney, Agent, or Firm* — Hewlett-Packard Patent Department

(57) ABSTRACT

A circuit module can include a substrate, photonic conversion units placed on the substrate; and a retention assembly. The retention assembly can include a heat sink in thermal contact with the photonic conversion units and a fastener. The fastener can be mechanically coupled to both the substrate and the heat sink, and configured to press the heat sink against the photonic conversion units. The plurality of photonic conversion units are removably secured to the substrate by the retention assembly without the use of a bonding material.

15 Claims, 2 Drawing Sheets

(51) Int. Cl.
*H04N 5/335* (2011.01)
*H05K 3/32* (2006.01)
*H01L 23/42* (2006.01)
*H01L 23/00* (2006.01)
*H01L 27/146* (2006.01)

(56) References Cited

U.S. PATENT DOCUMENTS

| | | | |
|---|---|---|---|
| 5,653,280 A * | 8/1997 | Porter | 165/80.3 |
| 5,699,229 A * | 12/1997 | Brownell | 361/719 |
| 6,249,436 B1 * | 6/2001 | Bollesen | 361/720 |
| 6,381,137 B1 * | 4/2002 | Kato et al. | 361/704 |
| 6,392,887 B1 * | 5/2002 | Day et al. | 361/704 |
| 6,459,842 B1 | 10/2002 | Arsenault et al. | |
| 6,588,943 B1 | 7/2003 | Howard | |
| 6,816,375 B2 * | 11/2004 | Kalyandurg | 361/704 |
| 6,981,542 B2 * | 1/2006 | Lopatinsky et al. | 165/80.3 |
| 7,307,845 B2 | 12/2007 | Mayer | |
| 7,310,226 B2 * | 12/2007 | Chen et al. | 361/695 |
| 7,603,040 B2 | 10/2009 | Vogley | |
| 7,626,822 B2 * | 12/2009 | Ma et al. | 361/719 |
| 2007/0047211 A1 * | 3/2007 | Refai-Ahmed et al. | 361/720 |
| 2009/0297101 A1 | 12/2009 | Ono et al. | |
| 2011/0267780 A1 * | 11/2011 | Thrailkill | 361/709 |

\* cited by examiner

CIRCUIT MODULE

BACKGROUND

Photonics can be implemented in computer and networking systems at successive levels of integration. Cabled solutions using industry standard plug-in modules are a common mechanism, though perhaps the least integrated with the surrounding electrical infrastructure. Alternatively, silicon photonics integrates photonics and electronics to a much higher degree. Between these two endpoint implementations exists a variety of solutions for providing conversion from electronics to photonics in conjunction with electrical functionality. Therefore, there is interest in approaches for integrating these solutions into package applications.

Figure 1:
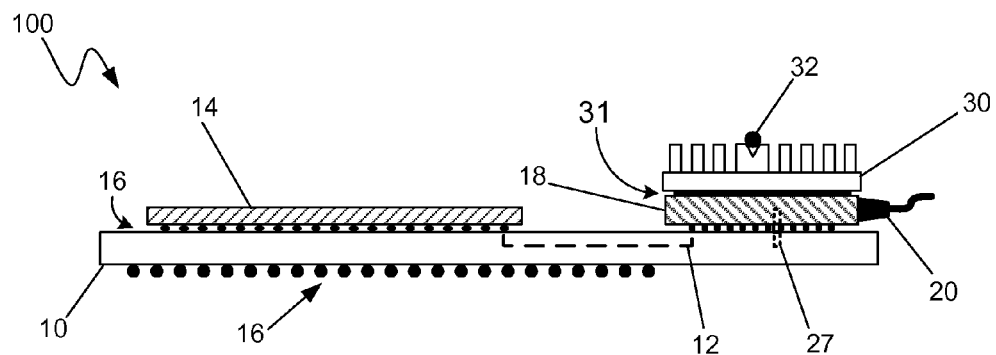
FIG. 1 is a cross-sectional view of a circuit module 100 in accordance with an embodiment of the present disclosure.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

In describing and claiming the present invention, the following terminology will be used in accordance with the definitions set forth below.

It is to be noted that, as used in this specification and the appended claims, the singular forms "a," "an," and "the" include plural referents unless the context clearly dictates otherwise.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "package" refers particularly to integrated circuit structures in which two or more electronic and/or photonic elements are interconnected through connections supported by a substrate board, also referred to herein as a "package substrate" or "substrate".

As used herein, "thermal contact" refers to an interface of physical contact between two bodies across which heat can be transferred. It is noted, however, that thermal contact can include direct surface-to-surface contact, as well as contact through a thin layer of thermally conductive compound, such as thermal grease or paste, etc. Likewise, the term "against" describes a state in which a first structure is situated in contact with a second structure and which excludes the presence of other structure(s) situated therebetween. However, this meaning does not exclude the presence of a thin layer of nonadhesive compound, e.g. thermal grease or paste, applied at the interface between the structures.

The embodiments described herein permit the co-packaging of electronic and photonic function while avoiding difficulties associated with differing attachment materials. For example, when permanent electrical connections are desired on an integrated circuit package, they are often soldered in place. Alternatively, when permanent photonic fiber connections are desired, the fibers are often held in place with special epoxy compounds. However, when an integrated assembly contains both a photonic connection and an electrical connection, process interactions can present a challenge. Soldering processes, particularly lead-free processes, can involve temperatures that are near or beyond the working range of many epoxy compounds. Therefore, it can be challenging to effect a reliable solder electrical attachment without degrading the epoxy photonic attachment. Additionally, when photonic conversion units are permanently attached to a multi-chip module, a single faulty channel on a single unit can necessitate replacing the entire module.

Issues often associated with multi-chip modules are addressed by the embodiments described herein. In particular, the present embodiments provide for easy replacement of electronic and photonic domains.

According to one embodiment, a circuit module can provide co-packaged electronic and photonic domains. In a particular aspect, the circuit module can include separable photonic conversion units to provide connectability between electronic domains and off-board photonic functions.

More particularly, the described embodiments permit the co-packaging of one or more ASICs together with photonic conversion functionalities. This can be desirable from a signal integrity perspective. A module containing an electrical logical function such as embodied in an ASIC, combined with integrated photonic connections can be a useful form factor for several system and switch functions found in computing and networking systems. Such a combination allows electrical paths between the ASIC function and the photonic conversion function to travel relatively short distances (as compared to a solution that places the circuit traces to the edge of a larger circuit card) and to travel through a less-challenging electrical environment, due to the absence of long board vias and board-level connectors. The result of these aspects of signal routing can be improved signal integrity and reduced power requirements.

Additionally, the problems of part yield and testability, often associated with multi-chip modules, are addressed as the units enabling conversion between the electronic and photonic domains can be easily replaced without exposing the module to solder reflow temperatures or exotic repair processes.

In another aspect of the embodiments described herein, the circuit module can include a thermal solution that can be shared among a plurality of photonic conversion units and can also secure the photonic conversion units in place. More particularly, the embodiments described herein further provide an opportunity to integrate a heat sink at the module level, rather than a heat sink per photonic conversion unit. In addition, the heat sink can be integrated into a retention assembly, providing a simple and integrated thermal solution that is easily serviceable. Accordingly, the heat sink and thermal interface need not be exposed to solder reflow temperatures, so that the integrity of thermal interface can be protected from disruption during replacement of electronic or photonic domains.

An exemplary embodiment of a circuit module 100 is shown in cross-section in FIG. 1. The circuit module can comprise a substrate 10 suitable for co-packaging one or more electronic functions with one or more photonic functions. More specifically, the substrate can be a standard package substrate made of a common package material, such as ceramic or organic material. The substrate can further include package traces 12 configured for electrical connections within and between domains, such as are found in large-scale integrated (LSI) and very large-scale integrated (VLSI) circuits. In a particular embodiment, the substrate 10 is a VLSI substrate.

The circuit module can further comprise at least one electronic function. In a particular embodiment, an electronic function can comprise an application-specific integrated circuit (ASIC) 14 attached to the substrate. The ASIC can be any one of a number of integrated circuit devices, such as a microprocessor, memory, crossbar, cache controller, and the like. The electronic function can comprise a single ASIC or a plurality of such devices.

The ASIC 14 can be attached to the substrate 10 using any of a number of techniques and materials conventional to the art. In a specific aspect, the ASIC is fixably attached to the substrate. In a more specific aspect, the ASIC is soldered to the substrate. In a still more specific aspect, lead-free solder can be employed to attach the ASIC. FIG. 1 shows an ASIC attached to a substrate by an exemplary ball-grid array (BGA) solder attachment 16. The substrate shown is also configured for attachment to a printed circuit board by another BGA on its opposite face; however, substrates having different attachment means, such as land grid array or pin grid array are also contemplated for use in the present embodiment.

The circuit module can further comprise at least one photonic function. In a particular embodiment, the photonic function can include a photonic conversion unit 18 or a plurality thereof. The photonic conversion unit can be any one of a number of structures employed in the art for converting on-package electrical signals to and from photonic signals. As such, a plurality of photonic conversion units can include any of transmitters, receivers, and transceivers. In a specific embodiment a photonic conversion unit can include a VCSEL. In one aspect a photonic conversion units can be configured to interface with standard optical connections such as multi-fiber push-on (MPO) or multi-fiber termination push-on (MTP) connectors.

Plug-in modules, such as SNAP-12 modules, are commonly used in the industry at the board level for converting between photonic and electrical signals. However, in some cases these modules may not size-effective for use in a co-packaged solution. In addition, the electrical performance of the separable electrical connector used to interface with these modules can suffer at high-frequencies. Furthermore, since this approach to photonic conversion is used at the board level rather than on-module, traces from an ASIC to the board are longer than those on a co-packaged module. In addition, such traces often must pass through at least two plated-through vias of a fairly thick PCB assembly, further reducing high-speed signal integrity. In recognition of such considerations, the present embodiment can provide for photonic conversion units that can be utilized in a co-packaged module while being separable from the substrate. In a particular embodiment, photonic conversion units connected to optical fibers by pigtail connections 20 can be used as illustrated in FIG. 1.

Figure 2:
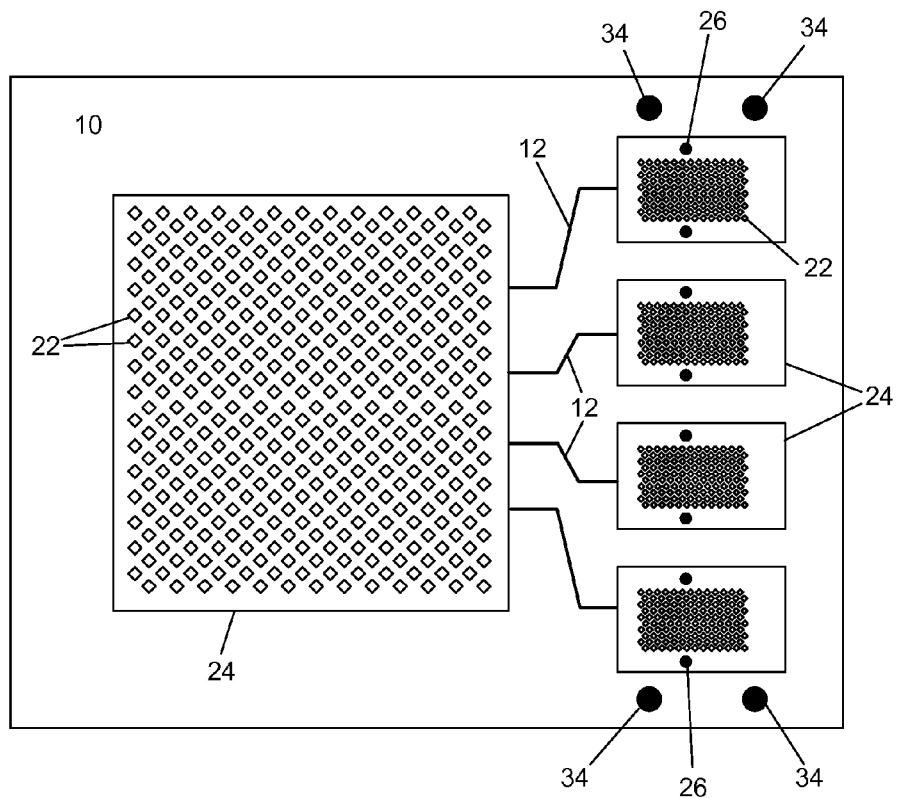
FIG. 2 is a top view of a package substrate 10 in accordance with an embodiment of the present disclosure.

As shown in the top view of a substrate 10 shown in FIG. 2, the substrate can include contacts 22 to serve as connection points between traces 12 and the packaged elements. A few traces are shown in FIG. 2 for purposes of illustration. However it should be noted that the substrate can include any number of traces depending on the number of connections needed in the circuit module 100. Contacts can be grouped in contact fields 24, where each field can comprise a number of contacts that can be arranged in correspondence with input or output terminals on a package element. Connectivity among elements can be provided by orienting each element so that its terminals make contact with appropriate trace contacts. Accordingly, a photonic conversion unit 18 of the present embodiment can be oriented on the substrate 10 so as to interface with trace contacts, and thereby connect through the traces with an ASIC 14 or other elements packaged on the module.

In one embodiment, proper orientation can be provided for a photonic conversion unit 18 or a plurality thereof by including guide mechanisms in the substrate 10. In a particular embodiment, a pin-and-guide hole mechanism can be employed. One such arrangement is illustrated in FIGS. 1 and 2, where guide holes 26 are included in the substrate to receive guide pins 27 included on photonic conversion units. In another embodiment, the substrate can include an interposer socket 28 as shown separately in FIG. 3, where the interposer socket provides alignment between the photonic conversion units and contacts on the substrate.

In a particular aspect of the embodiment, the photonic conversion units 18 are placed directly on the substrate 10 and aligned with contacts 22 without the use of a bonding material. More specifically, the photonic conversion units are placed in direct contact with a feature of the substrate such as a contact field or interposer socket and held in place without the use or presence of solder or any other bonding substance between the photonic conversion unit and said feature. According to the embodiment, contact with the substrate can be maintained by a mechanism that secures the unit while preserving separability. In a particular embodiment, the circuit module 100 comprises a retention assembly configured to removably secure photonic conversion units to the substrate. Each photonic conversion unit mounted in this way thereby can be connected to other domains on the module while remaining separable from the circuit module. Furthermore, this approach allows the use of photonic conversion units that do not require pin sockets, which are often not size-effective for small form factor package modules.

In a more particular embodiment, the retention assembly comprises a heat sink 30 placed in thermal contact with a photonic conversion unit 18 and a fastener by which the heat sink and photonic conversion unit are secured to the circuit module. This arrangement can be provided by placing the heat sink against the photonic conversion unit 18 to provide the thermal contact so that heat generated by the photonic conversion unit can enter the heat sink and be spread throughout and/or radiated away from the heat sink. Accordingly, the heat sink can be placed against any available surface of the photonic conversion unit through which adequate heat transfer can be affected. In a particular aspect, the heat sink can be placed against the opposite side of the photonic conversion unit from the substrate 10. One example of such an arrangement is shown in FIG. 1. In a more particular embodiment, a plurality of photonic conversion units and a heat sink are arranged so that the heat sink is in thermal contact with the plurality of photonic conversion units. In this way, a single thermal solution is shared among a number of photonic conversion units.

The thermal contact between the heat sink 30 and photonic conversion units 18 can include direct surface-to-surface contact. It should be noted that the described arrangement also admits contact through a thin layer of thermally conductive compound 31 applied to either of the contacting surfaces. Thermally conductive pastes, gels, greases, and the like can be included in a thin layer between the heat sink and photonic conversion unit in accordance with the embodiment.

The retention assembly can further comprise a fastener configured to press the heat sink 30 against the photonic conversion units 18. In one aspect, the fastener can be mechanically coupled to the substrate 10 and also to the heat sink so as to exert pressure on the photonic conversion units situated between these two members. In a particular embodiment, the pressure provided by the fastener can be such that the photonic conversion units are pressed against the substrate. Therefore one aspect of the embodiment is that the photonic conversion units can be secured to the circuit module 100 by the retention assembly without use of a bonding material. In a another aspect, the retention assembly can maintain an orientation of a photonic conversion unit relative to contacts 22 so as to preserve connections between the unit and other package elements.

Figure 3:
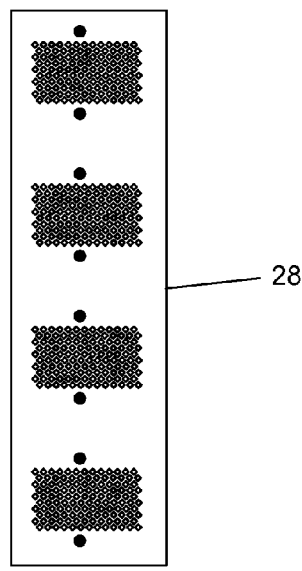
FIG. 3 is a top view of an interposer socket 28 in accordance with an aspect of an embodiment of the present disclosure.
Figure 4:
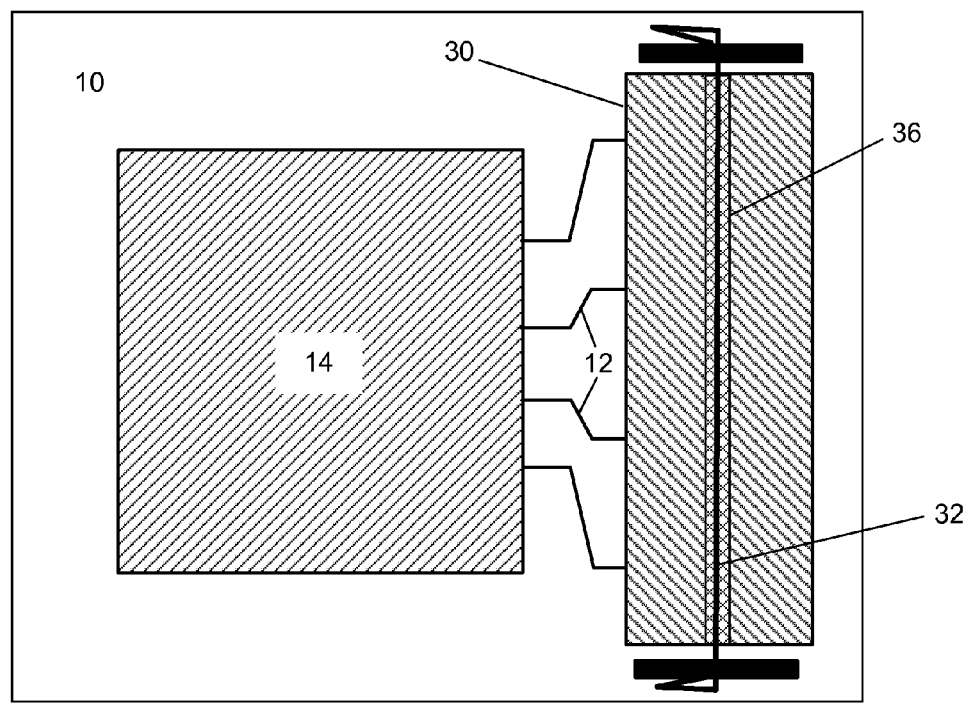
FIG. 4 is a top view of a circuit module 100 such as is shown in FIG. 1.

The fastener can comprise any mechanism that is suitable for pressing the heat sink 30 against the photonic conversion units 18. One aspect of the embodiment is that the photonic conversion units are removably secured to the substrate by the retention assembly. Accordingly, the fastener can be configured so that it can be disengaged from the conversion units or, alternatively, removed from the substrate altogether. In a particular embodiment, as illustrated in FIGS. 1 and 3, the fastener can comprise a spring clip 32 coupled to the substrate 10 and the heat sink. However other means for pressing the heat sink against the photonic conversion units can be used, such as a screw extending from the substrate to the heat sink.

In accordance with the use of a fastener, the substrate can include mounting holes 34 by which the fastener can be coupled to the substrate 10. Where the fastener comprises a spring clip 32, such holes can serve as insertion points to anchor the spring clip. Where the fastener comprises a screw, the mounting holes can accommodate insertion of the screw and can further include threading or other means of securing the screw. In addition, the heat sink 30 can include adaptations for coupling with the fastener. Where the fastener comprises a spring clip, the heat sink can include a detent 36 to receive the spring clip, as illustrated in FIG. 1. Where the fastener comprises a screw, the heat sink can include holes, sockets, threading, and the like to accommodate an end of the screw.

The fastener can exhibit various levels of integration into the structure of the circuit module 100. The fastener and heat sink 30 can be coupled so as to constitute a single structural unit. For example a spring clip may be permanently connected to the heat sink, permanently connected to the substrate 10, or both. In another example, the heads of one or more screws can be integrated into the body of the heat sink. In an alternative embodiment, the substrate and fastener can be configured so that the fastener is releasably coupled to the substrate, releasably coupled to the heat sink, or both.

In the embodiments described herein, the photonic conversion units 18 are removably secured to the substrate 10. More specifically, photonic conversion units can each be individually separated from the circuit module 100 by releasing the retention assembly. In one aspect, release can be accomplished by altering the configuration of the fastener to decrease the pressure exerted on the photonic conversion units through the heat sink 30. For example, where the fastener is a spring clip 32, the spring clip can be pulled away from the substrate to release a photonic conversion unit. In another embodiment, the fastener can be uncoupled from either the substrate or the heat sink to release a photonic conversion unit.

A method for co-packaging electronic and photonic function in a circuit module can comprise placing a plurality of photonic conversion units 18 on a substrate 10 and attaching an electronic function to the substrate. In a particular embodiment, the electronic function can comprise an ASIC 14. In one aspect of the embodiment, the ASIC is fixably attached to the substrate. In a particular embodiment, the ASIC is soldered to the substrate. In a still more specific aspect, lead-free solder can be employed to attach the ASIC.

The method can comprise placing the plurality of photonic conversion units 18 directly on the substrate 10 without using a bonding material to attach the units to the substrate. The photonic conversion units are instead removably secured using a thermal solution that retains them to the substrate as described above. Accordingly, the method further comprises placing a heat sink against the plurality of photonic conversion units, so as to provide thermal contact between the heat sink and the photonic conversion units. In a particular embodiment, thermal contact can be further provided by including a layer of a thermally conductive compound between the heat sink and at least one photonic conversion unit.

The method can further comprise coupling a fastener to the substrate and the heat sink so that the fastener presses the heat sink against the plurality of photonic conversion units. The plurality of photonic conversion units are thereby removably secured to the substrate.

The circuit module 100 with electronic and photonic functions can be installed onto a printed circuit board. The circuit module can be attached to the printed circuit board by an attachment such as are known in the art, including but not limited to a pin grid array, a land grid array, a ball grid array, and the like. In a particular embodiment, the circuit module can be soldered to a printed circuit board. In a more particular embodiment, the circuit module can be soldered using a lead-free solder.

An aspect of the present method is that the photonic conversion units 18 are removably secured to the substrate 10 without the use of a bonding material. As such, the circuit module can undergo soldering steps without disruption of the photonic conversion unit attachment by solder reflow temperatures. Therefore, in one embodiment, the circuit module can be soldered to a printed circuit board after the photonic conversion units have been attached to the substrate. In another embodiment, solder attachments can be unmade and remade without disruption of the photonic conversion unit attachment, allowing for replacement of soldered elements. In one aspect, an ASIC soldered to the substrate can be replaced while maintaining the attachment of photonic conversion units to the substrate.

Summarizing and reiterating to some extent, a circuit module has been invented which allows the co-packaging of electronic and photonic function while avoiding difficulties associated with differing attachment materials. The circuit module can include an electronic function mounted on a substrate, and said electronic function can be fixably attached to the substrate. The circuit module can further include a photonic function removably secured to the substrate. In particular, elements of the photonic function can be secured using a retention assembly that comprises a thermal solution that is shared among the elements.

The embodiments described avoid conflict arising from requirements between the processes used for permanent photonic connections and permanent electronic connections, allowing improved module yield as well as increased flexibility in manufacturing operations. They further provide a mechanism compatible with modules that are BGA soldered to the main printed circuit board, PGA socket attached to the main printed circuit board, or LGA socket attached to the main printed circuit board. This solution also provides mitigation for the traditional multi-chip module issues of test, yield, and repairability, reducing overall module risk.

While the forgoing exemplary embodiments are illustrative of the principles of the present invention, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A circuit module comprising:
   a substrate;
   a plurality of photonic conversion units placed on the substrate; and
   a retention assembly, comprising:
      a heat sink situated in thermal contact with the plurality of photonic conversion units; and
      a fastener mechanically coupled to both the substrate and the heat sink, and configured to press the heat sink against the plurality of photonic conversion units,
   wherein the plurality of photonic conversion units are removably secured to the substrate by the retention assembly without the use of a bonding material.

2. The circuit module of claim 1, further comprising an ASIC soldered to the substrate and in electrical connection with at least one of the photonic conversion units.

3. The circuit module of claim 2, wherein the ASIC is soldered to the substrate with lead-free solder.

4. The circuit module of claim 1, further comprising a thermally conductive compound situated between the heat sink and at least one photonic conversion unit.

5. The circuit module of claim 1, wherein the fastener is releasably coupled to the substrate.

6. The circuit module of claim 1, wherein the fastener is releasably coupled to the heat sink.

7. The circuit module of claim 1, wherein the fastener includes one of a spring clip and a screw.

8. The circuit module of claim 1, wherein the photonic conversion units are oriented on the substrate by a pin-and-guide hole mechanism.

9. The circuit module of claim 1, wherein the photonic conversion units are oriented on the substrate by an interposer socket.

10. The circuit module of claim 1, wherein the photonic conversion units include a fiber pigtail.

11. The circuit module of claim 1, wherein the photonic conversion units include a VCSEL.

12. A method of co-packaging electronic and photonic function in a circuit module, comprising:
    soldering an ASIC to a substrate;
    placing a plurality of photonic conversion units directly on the substrate without use of a bonding material;
    placing a heat sink against the plurality of photonic conversion units to provide thermal contact between the heat sink and at least one of the photonic conversion units;
    coupling a fastener to the substrate and to the heat sink so that the fastener presses the heat sink against the plurality of photonic conversion units, thereby removably securing the plurality of photonic conversion units to the substrate.

13. The method of claim 12, further including soldering the substrate to a printed circuit board.

14. The method of claim 12, wherein thermal contact is further provided by including a layer of a thermally conductive compound between the heat sink and at least one photonic conversion unit.

15. The method of claim 12, wherein the fastener includes one of a spring clip and a screw.

\* \* \* \* \*